(12) United States Patent
Rosselli et al.

(10) Patent No.: US 9,311,975 B1
(45) Date of Patent: Apr. 12, 2016

(54) BI-SYNCHRONOUS ELECTRONIC DEVICE AND FIFO MEMORY CIRCUIT WITH JUMP CANDIDATES AND RELATED METHODS

(71) Applicant: STMICROELECTRONICS S.r.l., Agrate Brianza (IT)

(72) Inventors: Salvatore Marco Rosselli, Catania (IT); Giuseppe Guarnaccia, Francofonte (IT); Ugo Mari, Tremestieri (IT)

(73) Assignee: STMICROELECTRONICS S.R.L., Agrate Brianza (MB) (IT)

(*) Notice: Subject to any disclaimer, the term of this patent is extended or adjusted under 35 U.S.C. 154(b) by 0 days.

(21) Appl. No.: 14/508,321

(22) Filed: Oct. 7, 2014

(51) Int. Cl.
*G11C 7/22* (2006.01)
*G06F 5/06* (2006.01)

(52) U.S. Cl.
CPC .. *G11C 7/222* (2013.01); *G06F 5/06* (2013.01)

(58) Field of Classification Search
CPC ........ G11C 8/04; G11C 19/188; G11C 7/222; G11C 19/0875; G11C 19/287; G06F 5/06
See application file for complete search history.

(56) References Cited

U.S. PATENT DOCUMENTS

| | | | |
|---|---|---|---|
| 5,577,055 A * | 11/1996 | Westerlund | G06F 11/1016 714/800 |
| 2004/0015666 A1 * | 1/2004 | Rojas | G06F 5/12 711/159 |
| 2009/0049212 A1 * | 2/2009 | Mangano | H04L 7/005 710/61 |
| 2011/0213944 A1 * | 9/2011 | Guarnaccia | G06F 13/4059 711/167 |

OTHER PUBLICATIONS

Cummings, "Simulation and Synthesis Techniques for Asynchronous FIFO Design," SNUG, San Jose, 2002, pp. 1-23.

* cited by examiner

*Primary Examiner* — Khamdan Alrobaie

(74) *Attorney, Agent, or Firm* — Allen, Dyer, Doppelt, Milbrath & Gilchrist, P.A.

(57) ABSTRACT

A bi-synchronous electronic device may include a FIFO memory circuit, and a first digital circuit coupled to the FIFO memory circuit and configured to operate based upon a first clock signal, and write to the FIFO memory circuit based upon a write pointer. The bi-synchronous electronic device may include second digital circuit coupled to the FIFO memory circuit and configured to operate based upon a second clock signal different from the first clock signal, and read from the FIFO memory circuit based upon a read pointer. The FIFO memory circuit may be configured to detect a jump in the write pointer to a new position, determine jump candidates for the read pointer from a current position, select a jump candidate, and synchronize the read pointer based upon the selected jump candidate.

22 Claims, 7 Drawing Sheets

| DECIMAL | BINARY | GRAY |
|---------|--------|------|
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |
| 8 | 1000 | 1100 |
| 9 | 1001 | 1101 |
| 10 | 1010 | 1111 |
| 11 | 1011 | 1110 |
| 12 | 1100 | 1010 |
| 13 | 1101 | 1011 |
| 14 | 1110 | 1001 |
| 15 | 1111 | 1000 |

*FIG. 5*

BI-SYNCHRONOUS ELECTRONIC DEVICE AND FIFO MEMORY CIRCUIT WITH JUMP CANDIDATES AND RELATED METHODS

TECHNICAL FIELD

The present disclosure relates to the field of electronic devices, and, more particularly, to a bi-synchronous electronic device with a first-in-first-out memory circuit and related methods.

BACKGROUND

In integrated circuits (ICs), the electrical heart beat of the circuitry is the clock signal and it regulates the pace of operation for many circuits therein. In some relatively complex ICs, such as a system-on-chip (SoC), there may be complex systems for communication between different modules of an IC (for example, a processing unit, memories, peripherals, and other dedicated units) so as to ensure observance of the specifications of performance of the system. Indeed, in certain SoC applications, some of the components may operate with different clock speeds.

In some SoC applications, the IC may include first-in-first-out (FIFO) queues between devices with different clock frequencies. For example, a FIFO queue can be set between a first device, such as a microprocessor, which writes information in the FIFO queue and a second device, such as a peripheral or a second microprocessor, which reads the information from the FIFO queue. Each device reads and writes data in the FIFO queue with a rate equal to that of its own clock. The presence of the FIFO queue serves to enable co-existence of the two domains in the SoC with different clock frequencies. The FIFO queue serves as a buffer for regulating the flow of data between devices that work at different clock speeds.

Referring to FIGS. 1-2, an approach to a FIFO memory queue 200 is now described. The FIFO memory queue 200 includes a first write logic circuit 201 operating based upon a first clock signal, a second read logic circuit 202 operating based upon a second clock signal, a memory core 203 coupled between the logic circuits, and a pointer synchronization circuit 204 also coupled between the logic circuits.

The pointer synchronization circuit 204 includes a write enable block 210 receiving a write enable signal from the first write logic circuit 201, a first binary-to-Gray encoder block 211 coupled to the write enable block, a first flip-flop block 212 coupled to the first binary-to-Gray encoder block, first and second blocks 213a-213b coupled in succession to the first flip-flop block, a first Gray-to-binary encoder block 223 coupled to the second block, and a first compare block 214 coupled to the first Gray-to-binary encoder block and outputting a FIFO empty signal. The pointer synchronization circuit 204 includes a read enable block 221 receiving a read pulse from the second read logic circuit 202, a second Gray-to-binary encoder block 222 coupled to the read enable block, a second binary-to-Gray encoder block 220 coupled to the read enable block, a second flip-fop block 219 coupled to the second binary-to-Gray encoder block, first and second blocks 218a-218b coupled in succession to the second flip-flop block, a third Gray-to-binary encoder block 217 coupled to the second block, a fourth Gray-to-binary encoder block 215 coupled to the first flip-flop block 212, and a second compare block 216 coupled to the third Gray-to-binary encoder block and outputting a FIFO full signal to the first write logic circuit 201.

In this FIFO memory queue 200, the memory core 203 is written in the first clock domain, and only one location can be pushed in the memory core in a write-domain cycle. The read domain retrieves data from the memory core 203 in the second-clock domain, one location per read-domain cycle.

SUMMARY

Generally speaking, a bi-synchronous electronic device may include a FIFO memory circuit, and a first digital circuit coupled to the FIFO memory circuit and configured to operate based upon a first clock signal, and write to the FIFO memory circuit based upon a write pointer. The hi-synchronous electronic device may include a second digital circuit coupled to the FIFO memory circuit and configured to operate based upon a second clock signal different from the first clock signal, and read from the FIFO memory circuit based upon a read pointer. The FIFO memory circuit may be configured to detect a jump in the write pointer to a new position, determine a plurality of jump candidates for the read pointer from a current position, select a jump candidate from the plurality thereof, and synchronize the read pointer based upon the selected jump candidate.

In particular, each jump candidate may comprise a Gray encoding jump candidate for the read pointer from the current position. The FIFO memory circuit may be configured to select the jump candidate based upon a distance between the new position and respective positions of the plurality of jump candidates. The FIFO memory circuit may be configured to discard jump candidates with respective positions less than the current position and greater than the new position. The FIFO memory circuit may be configured to synchronize the read pointer by Gray encoded incrementing the read pointer from a respective position of the selected jump candidate to the new position. The FIFO memory circuit may be configured to, when an additional jump in the write pointer is detected, determine a second plurality of jump candidates for the read pointer from a respective position of the selected jump candidate.

In some embodiments, the FIFO memory circuit comprises processing circuitry, and a memory core coupled to the processing circuitry and configured to store data for transfer from the first digital circuit to the second digital circuit. The jump in the write pointer to the new position may comprise a non-consecutive jump from the current position. For example, the FIFO memory circuit may comprise a 16-128 bit bi-synchronous FIFO memory.

Another aspect is directed to a method of operating a bi-synchronous electronic device comprising a FIFO memory circuit. The method may include using a first digital circuit coupled to the FIFO memory circuit to operate based upon a first clock signal, and write to the FIFO memory circuit based upon a write pointer. The method may include using a second digital circuit coupled to the FIFO memory circuit to operate based upon a second clock signal different from the first clock signal, and read from the FIFO memory circuit based upon a read pointer. The method may further include using the FIFO memory circuit to detect a jump in the write pointer to a new position, determine a plurality of jump candidates for the read pointer from a current position, select a jump candidate from the plurality thereof, and synchronize the read pointer based upon the selected jump candidate.

BRIEF DESCRIPTION OF THE DRAWINGS

FIG. 5 is a table illustrating operation of the bi-synchronous electronic device of FIG. 3.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

In SoC products, such as application processors, microcontrollers, circuitry for mobile and multimedia applications (smartphone/tablets, Set-top Box, Home Gateway, etc.), it is typical to partition the digital logic into different domains. Clock domains are digital sections of the SoC in which the synchronous sequential logic is driven by a dedicated clock. Subsequently, communication between clock domains is designed through hi-synchronous, multi-synchronous or asynchronous techniques that allow signals to cross from the transmitter to the receiver in a safe way (i.e. the signals must be received stable and mutually correlated). In order to guarantee such signals' integrity, clock domain crossing can be poor in terms of latency, expensive in terms of area occupation, dissipative in dynamic power and complex to manage.

This present disclosure may offer an approach applicable to several semiconductor products, especially when traffic shapes are difficult to predict, and may allow for faster clock-domain crossing by way of an adaptive code sequence to synchronize the pointers of a multi-clock FIFO with improved performance with regards to traditional Gray encoding.

Figure 1:
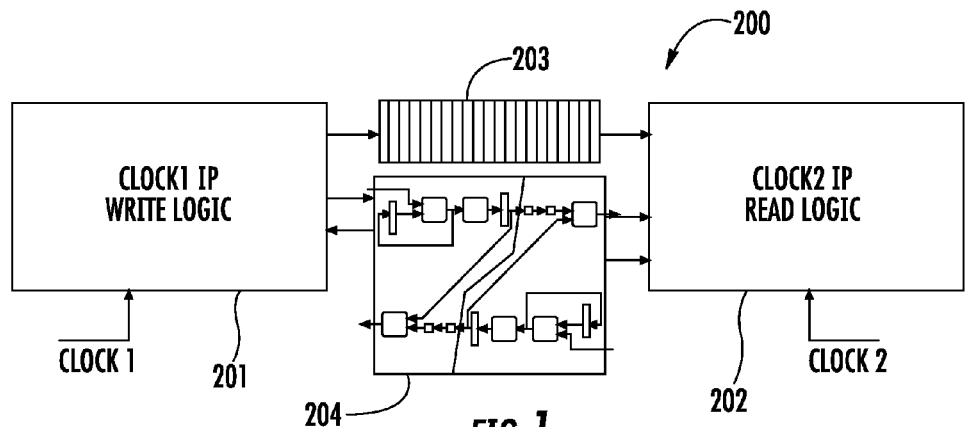
FIG. 1 is a schematic diagram of a FIFO memory queue, according to the prior art.
Figure 2:
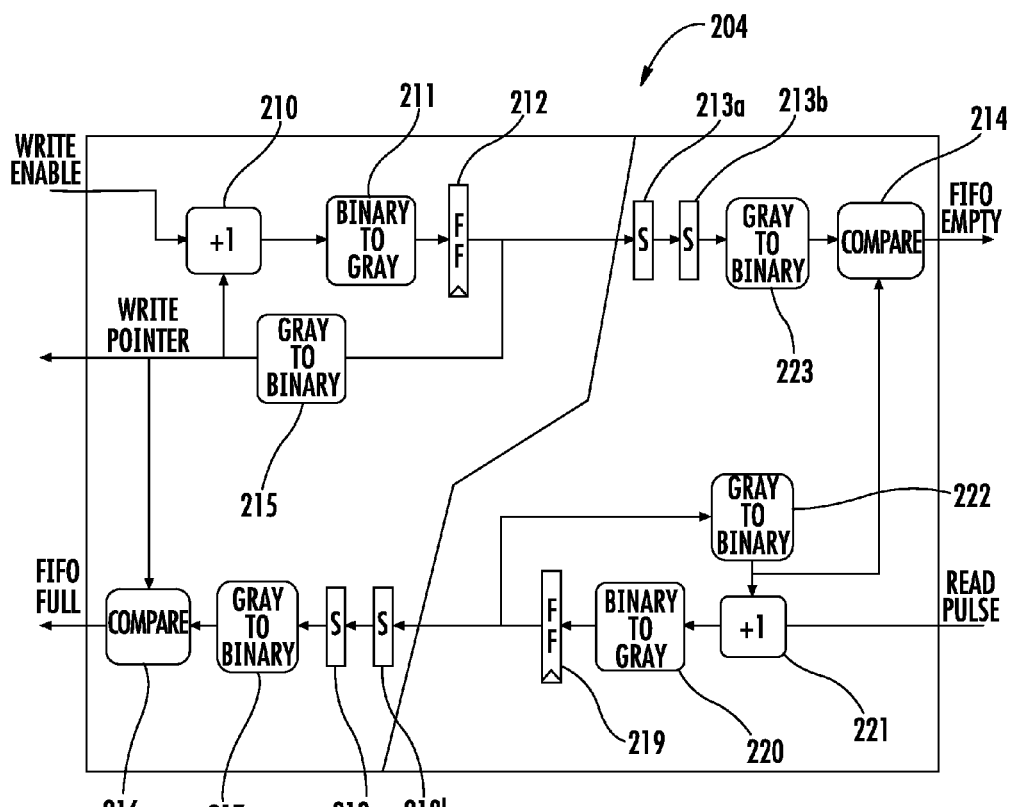
FIG. 2 is a schematic diagram of the pointer synchronization circuit from the FIFO memory queue of FIG. 1.
Figure 3:
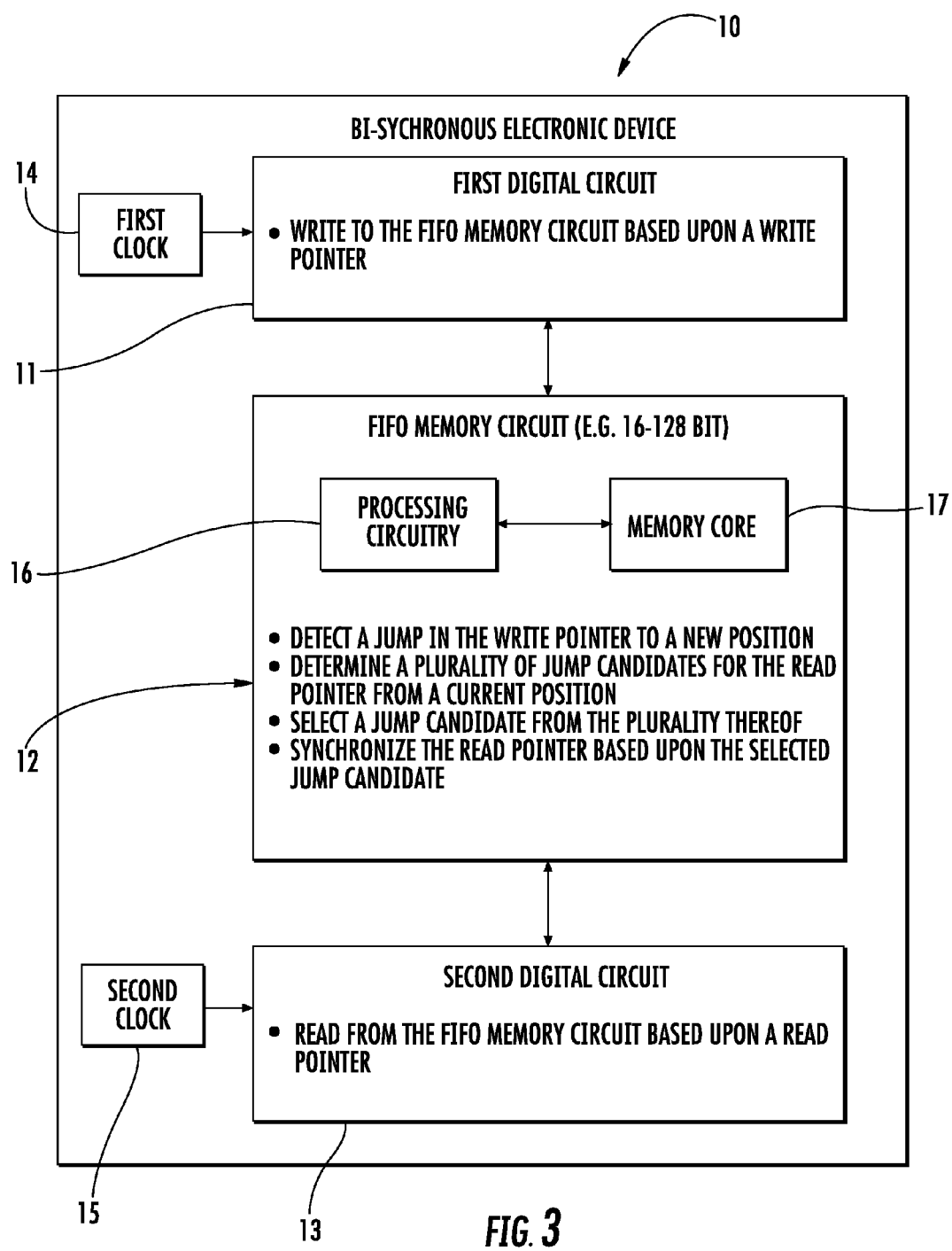
FIG. 3 is a schematic diagram of a bi-synchronous electronic device, according to the present disclosure.

Referring initially to FIG. 3, a bi-synchronous electronic device 10 according to the present disclosure is now described. The bi-synchronous electronic device 10 illustratively includes a FIFO memory circuit 12 configured to store data, a first clock 14 generating a first clock signal, and a first digital circuit 11 coupled to the FIFO memory circuit and the first clock. The bi-synchronous electronic device 10 illustratively includes a second clock 15 generating a second clock signal, and a second digital circuit 13 coupled to the FIFO memory circuit 12 and the second clock.

The FIFO memory circuit 12 illustratively includes processing circuitry 16, and a memory core 17 coupled to the processing circuitry and configured to store data for transfer between the first and second digital circuits 11, 13. For example, the FIFO memory circuit 12 may comprise a 16-128 bit bi-synchronous FIFO memory.

The first digital circuit 11 is coupled to the FIFO memory circuit 12 and configured to operate based upon the first clock signal, and write to the FIFO memory circuit based upon a write pointer. The second digital circuit 13 is coupled to the FIFO memory circuit 12 and configured to operate based upon the second clock signal, the second clock signal being different from the first clock signal, and read from the FIFO memory circuit based upon a read pointer.

During data transfer from the first digital circuit 11, the FIFO memory circuit 12 is configured to detect a jump in the write pointer to a new position. For example, the jump in the write pointer may be the result of a data burst from the first digital circuit 11. The FIFO memory circuit 12 is configured to determine a plurality of jump candidates for the read pointer from a current position. In particular, each jump candidate may comprise a Gray encoding jump candidate for the read pointer from the current position, i.e. the new location does not violate Gray encoding rules.

The FIFO memory circuit 12 is configured to select a jump candidate from the plurality thereof. More specifically, the FIFO memory circuit 12 may be configured to select the jump candidate based upon a distance between the new position and respective positions of the plurality of jump candidates. The FIFO memory circuit 12 may be configured to discard jump candidates with respective positions less than the current position and greater than the new position.

The FIFO memory circuit 12 is configured to synchronize the read pointer based upon the selected jump candidate. The FIFO memory circuit 12 may be configured to synchronize the read pointer by Gray encoded incrementing (within Gray encoding rules) the read pointer from a respective position of the selected jump candidate to the new position.

In some embodiments (FIG. 6), the FIFO memory circuit 12 may be configured to, when an additional jump in the write pointer is detected, determine a second plurality of jump candidates for the read pointer from a respective position of the selected jump candidate. The jump in the write pointer the new position may comprise a non-consecutive jump from the current position.

Another aspect is directed to a method of operating a bi-synchronous electronic device 10 comprising a FIFO memory circuit 12. The method may include using a first digital circuit 11 coupled to the FIFO memory circuit 12 to operate based upon a first clock signal, and write to the FIFO memory circuit based upon a write pointer. The method may include using a second digital circuit 13 coupled to the FIFO memory circuit 12 to operate based upon a second clock signal different from the first clock signal, and read from the FIFO memory circuit based upon a read pointer. The method may further include using the FIFO memory circuit 12 to detect a jump in the write pointer to a new position, determine a plurality of jump candidates for the read pointer from a current position, select a jump candidate from the plurality thereof, and synchronize the read pointer based upon the selected jump candidate.

Advantageously, the bi-synchronous electronic device 10 may improve the performance of the synchronization mechanism without any change in the typical structure of the multi-clock FIFO. In particular, the bi-synchronous electronic device 10 may perform better than the prior art in terms of bandwidth usage. The bi-synchronous electronic device 10 may possess flexibility that makes it suitable for several traffic categories in multi-clock designs: the Gray encoder is removed from the synchronization chain and a convenient sequence is inferred according to an adaptive algorithm that allows the disclosed embodiments to handle non-constant traffic in a simple way (e.g. exploiting the pointer jumps). Such improvements may be valuable in many fields of application, and particularly, for SoC peripherals, whose traffic is often driven by the user, can be hard to predict and can require some data manipulation (e.g. re-ordering).

Figure 4:
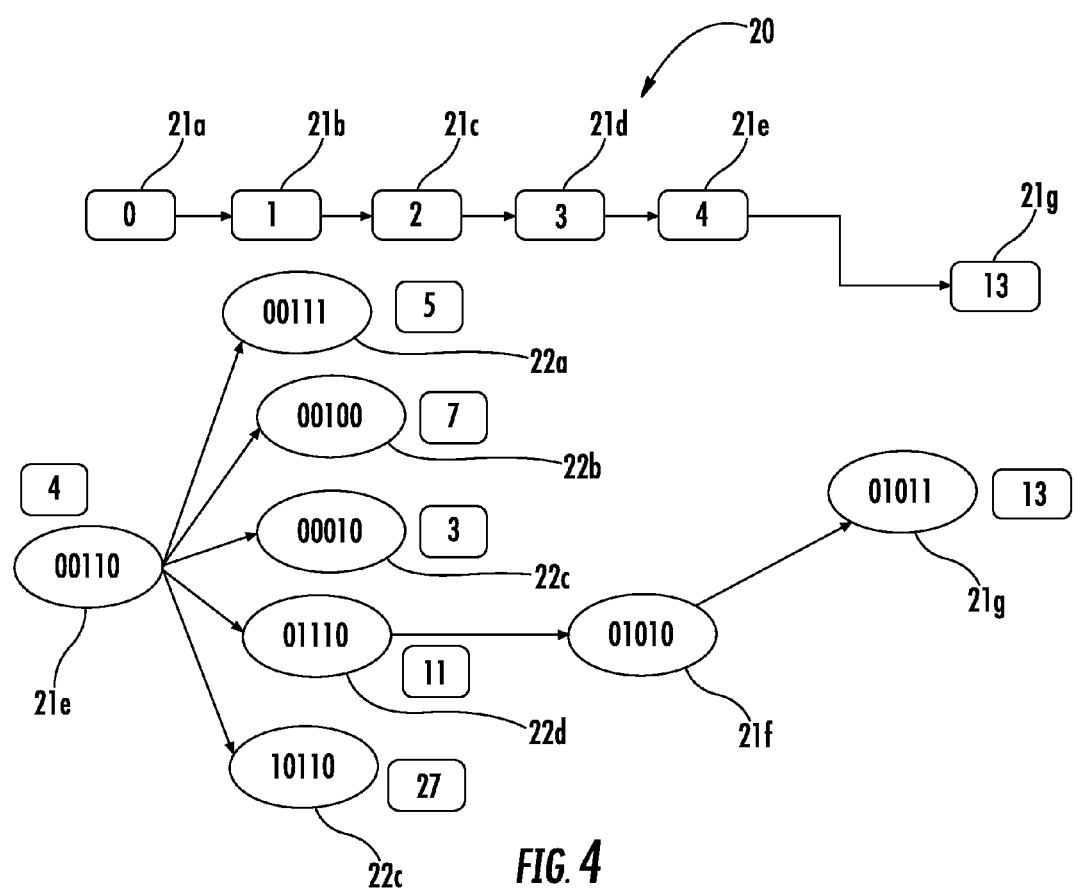
FIG. 4 is a flowchart illustrating operation of the bi-synchronous electronic device of FIG. 3.

Referring now additionally to FIGS. 4-5, a flowchart 20 and a table 30 illustrate exemplary operation of the bi-synchronous electronic device 10. In this illustrated operational example, the write pointer increments normally, i.e. Gray-like, through memory locations 0-4 21a-21e and jumps from memory location 4 21f to new memory location 13 21g. The second digital circuit 13 determines a plurality of jump candidates 22a-22e, and selects the best one based upon distance to the new position (e.g., illustrated 01010 memory location 21f). The second digital circuit 13 then increments normally in Gray encoded fashion to final memory location 21g.

Gray encoding is suitable for synchronization because two consecutive encoded values have unitary Hamming distance (i.e. only one bit changes between a code word and the following one). Given a code word, typical Gray encoding is only one in a set of legal binary words: it corresponds in particular to a binary "+1" operation on unsigned vectors. Assuming the write pointer (FIFO pointer) jumps from a value to a non-consecutive one (e.g. the illustrated jump from 4 to 13), by exploring the set of legal words (i.e. all the words whose Gray equivalent differs by one bit only), a group of jump candidates exists 22a-22e, among which, according to the current Gray pointer value and the desired binary destination, a convenient code word 21f is always available (the worst case being the "+1" value itself).

The bi-synchronous electronic device 10 considers letting the binary pointer span any count sequence and driving the convergence of the synchronization by way of Gray-like correlation-safe jumps (i.e. generating the set of candidates and choosing the most appropriate among them). The algorithm is adaptive, because it can always rely on new jump opportunities on any following cycle. The binary pointer jumps from 4 to 13.

By considering the Gray equivalent of decimal 4, for its code word, there are 5 possible jumps. Code words corresponding to values that are greater than the target memory location (e.g. memory location 27 22e is greater than memory location 13 21g) or smaller than the starting point (e.g. memory location 3 22c is smaller than memory location 4 21e) are discarded. Among the remaining jumps, the most suitable one is selected (e.g. the illustrated memory location 11 22d). At least one path to the target is always present by construction: the existence of the "+1" operation is ensured and allows the algorithm to converge to the desired value under any circumstance, while the jumps allow it to speed up the process.

Figure 6:
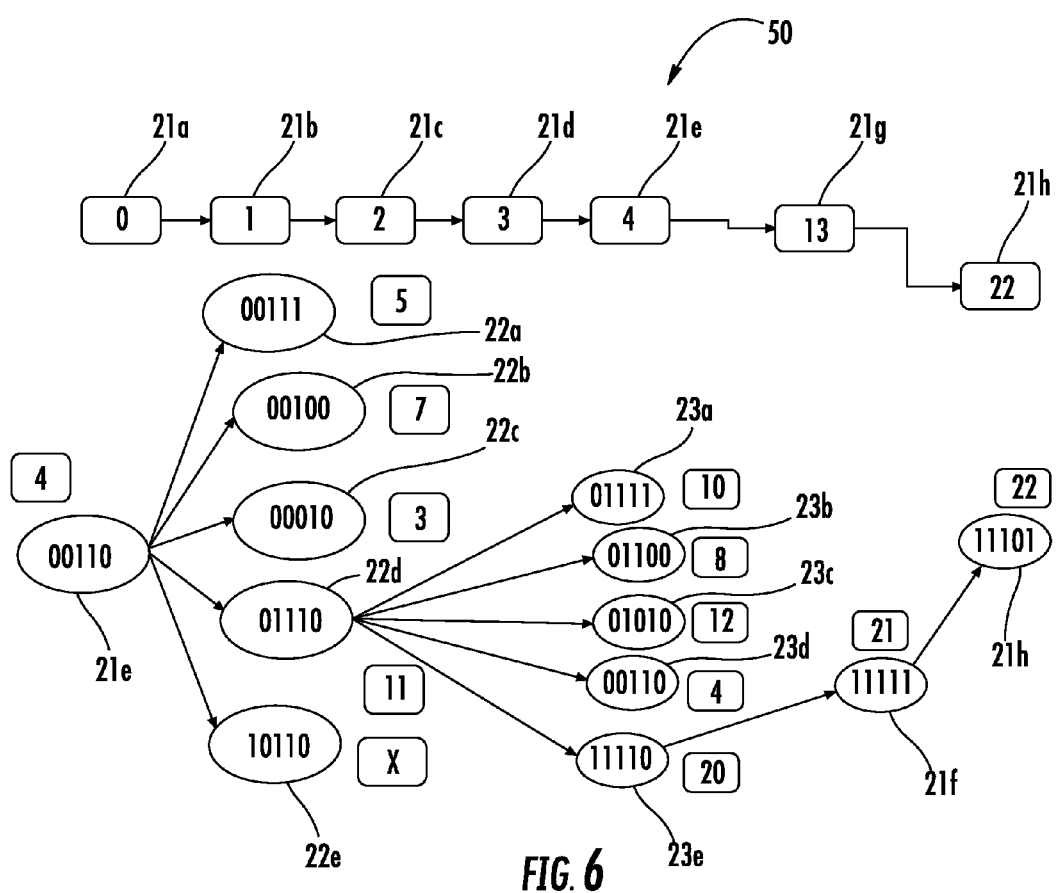
FIG. 6 is another flowchart illustrating operation of the bi-synchronous electronic device of FIG. 3.

Referring now additionally to FIG. 6, a flowchart 50 illustrates another exemplary operation of the bi-synchronous electronic device 10, and is similar to that of FIG. 4. In this illustrated example, while the read pointer synchronizes to the new jump position at memory location 13 21g, the FIFO memory circuit 12 detects the write pointer making a second jump to memory location 22 21h. The FIFO memory circuit 12 determines a second plurality of jump candidates 23a-23e for the read pointer from a respective position of the selected jump candidate 23e from the first plurality of jump candidates 22a-22e. The FIFO memory circuit 12 selects a second jump candidate 23e at memory location 20, and increments normally in Gray encoded fashion through position 21f to final memory location 21h. Advantageously, new jump opportunities arise from any new code word, so that the path to the target is dynamically recomputed at any cycle, according to the traffic shape (adaptive algorithm).

Figure 7:
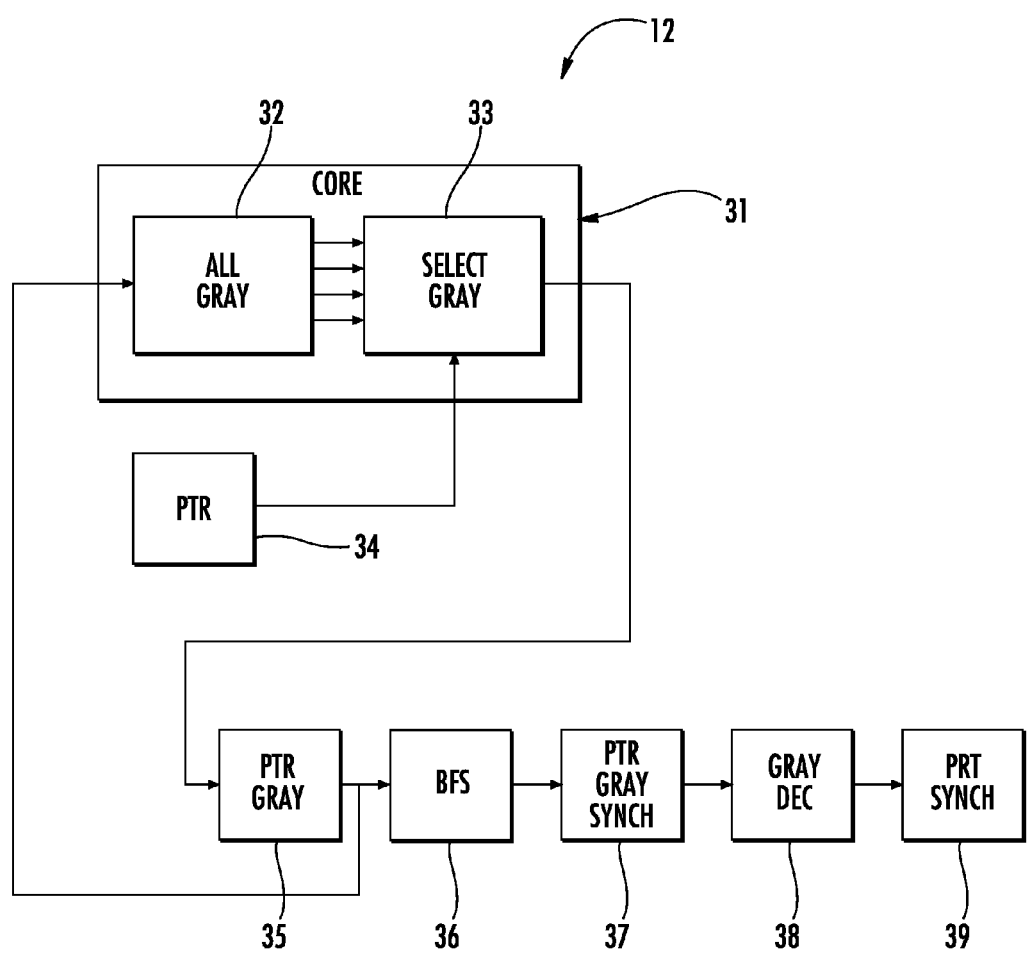
FIG. 7 is a detailed schematic diagram of the FIFO memory circuit of FIG. 3.

Referring now to FIG. 7, an exemplary hardware embodiment of the FIFO memory circuit 12 is now described. This FIFO memory circuit 12 illustratively includes processing circuitry 31 comprising a Gray encoding block 32, and a select Gray block 33 coupled thereto. This FIFO memory circuit 12 illustratively includes a pointer block 34 coupled to the select Gray block 33, a pointer Gray block 35 coupled to the processing circuitry, a brute force synchronizer block 36 coupled to the pointer Gray block, a pointer Gray synchronizer block 37 coupled to the brute force synchronizer block, a Gray decoder block 38 coupled to the pointer Gray synchronizer block, and a pointer synchronizer block 39 coupled to the Gray decoder block.

FIG. 7 discloses the core block (processing circuitry 31) as an encoder-equivalent circuit comprising a candidate generator (Gray encoding block 32) and a candidate selector (select Gray block 33). More detail on the core block is shown in FIG. 8.

The core block makes use of the current binary pointer value (pointer block 34) to generate a Gray-like pointer (pointer Gray block 35). In particular, the core block acts as a typical Gray encoder, but for the fact that it is able to provide a convenient adaptive sequence. The brute-force synchronizer (brute force synchronizer block 36) bridges the Gray-like pointer to the read domain and into a synchronized Gray-like pointer (pointer Gray synchronizer block 37). The traditional Gray decoder (Gray decoder block 38) detects the synchronized pointer binary value (pointer synchronizer block 39).

Figure 8:
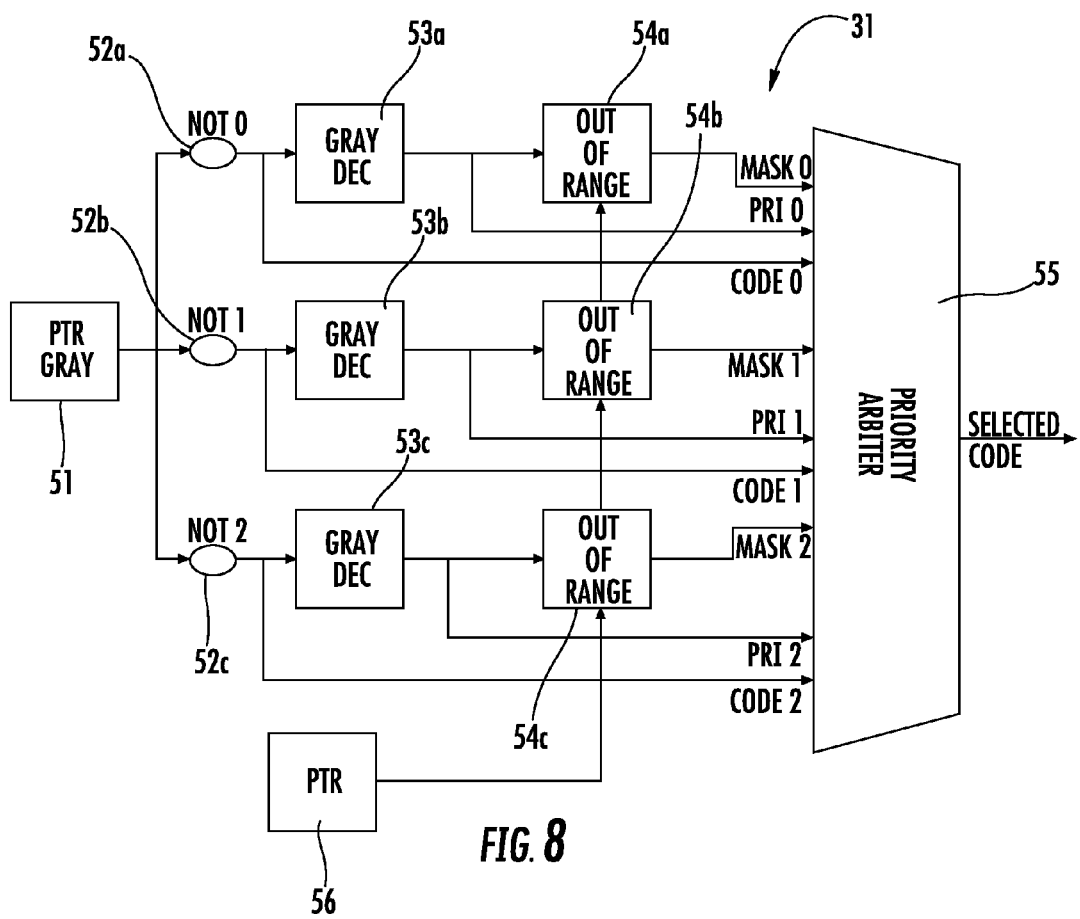
FIG. 8 is a detailed schematic diagram of the bi-synchronous electronic device of FIG. 3.

Referring now to FIG. 8, an exemplary hardware embodiment of the processing circuitry 31 is now described. The processing circuitry 31 illustratively includes a pointer Gray block 51 (Gray follower), a plurality of NOT blocks 52a-52c (1-bit inversion) coupled to the pointer Gray Block, a plurality of Gray decoders 53a-53c respectively coupled to the plurality of NOT blocks, a plurality of Out-of-Range blocks 54a-54c (software programmable thresholds) coupled respectively to the plurality of Gray decoders, a pointer block 56 (binary target) coupled to the plurality of Out-of-Range blocks, and a priority arbiter 55 (software programmable) coupled to the plurality of Out of Range blocks and generating a selected code (next value of the Gray follower).

This exemplary hardware embodiment includes software-programmable thresholds (i.e. a maximum allowed jump) and a priority arbiter 55. No Gray encoders (just decoders 53a-53c) are required at any stage of the synchronization chain, because the codes are generated by single-bit inversions.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A bi-synchronous electronic device comprising:
  a first-in-first-out (FIFO) memory circuit;
  a first digital circuit coupled to said FIFO memory circuit and configured to
    operate based upon a first clock signal, and
    write to said FIFO memory circuit based upon a write pointer; and
  a second digital circuit coupled to said FIFO memory circuit and configured to
    operate based upon a second clock signal different from the first clock signal, and
    read from said FIFO memory circuit based upon a read pointer;
  said FIFO memory circuit configured to detect a jump in the write pointer to a new position,
determine a plurality of jump candidates for the read pointer from a current position,
select a jump candidate from the plurality thereof, and
synchronize the read pointer based upon the selected jump candidate.

2. The bi-synchronous electronic device of claim 1 wherein each jump candidate comprises a Gray encoding jump candidate for the read pointer from the current position.

3. The bi-synchronous electronic device of claim 1 wherein said FIFO memory circuit is configured to select the jump candidate based upon a distance between the new position and respective positions of the plurality of jump candidates.

4. The bi-synchronous electronic device of claim 1 wherein said FIFO memory circuit is configured to discard jump candidates with respective positions less than the current position and greater than the new position.

5. The bi-synchronous electronic device of claim 1 wherein said FIFO memory circuit is configured to synchronize the read pointer by Gray encoded incrementing the read pointer from a respective position of the selected jump candidate to the new position.

6. The bi-synchronous electronic device of claim 1 wherein said FIFO memory circuit is configured to, when an additional jump in the write pointer is detected, determine a second plurality of jump candidates for the read pointer from a respective position of the selected jump candidate.

7. The bi-synchronous electronic device of claim 1 wherein said FIFO memory circuit comprises processing circuitry, and a memory core coupled to said processing circuitry and configured to store data for transfer from said first digital circuit to said second digital circuit.

8. The bi-synchronous electronic device of claim 1 wherein the jump in the write pointer to the new position comprises a non-consecutive jump from the current position.

9. The bi-synchronous electronic device of claim 1 wherein said FIFO memory circuit comprises a 16-128 bit bi-synchronous FIFO memory.

10. A first-in-first-out (FIFO) memory circuit to be coupled in a bi-synchronous electronic device comprising a first digital circuit operating based upon a first clock signal, and writing to the FIFO memory circuit based upon a write pointer, and a second digital circuit operating based upon a second clock signal different from the first clock signal, and reading from the FIFO memory circuit based upon a read pointer, the FIFO memory circuit comprising:
processing circuitry, and a memory core coupled to said processing circuitry and configured to
store data for transfer from the first digital circuit to the second digital circuit,
detect a jump in the write pointer to a new position,
determine a plurality of jump candidates for the read pointer from a current position,
select a jump candidate from the plurality thereof, and
synchronize the read pointer based upon the selected jump candidate.

11. The FIFO memory circuit of claim 10 wherein each jump candidate comprises a Gray encoding jump candidate for the read pointer from the current position.

12. The FIFO memory circuit of claim 10 wherein said processing circuitry is configured to select the jump candidate based upon a distance between the new position and respective positions of the plurality of jump candidates.

13. The FIFO memory circuit of claim 10 wherein said processing circuitry is configured to discard jump candidates with respective positions less than the current position and greater than the new position.

14. The FIFO memory circuit of claim 10 wherein said processing circuitry is configured to synchronize the read pointer by Gray encoded incrementing the read pointer from a respective position of the selected jump candidate to the new position.

15. The FIFO memory circuit of claim 10 wherein said FIFO memory circuit is configured to, when an additional jump in the write pointer is detected, determine a second plurality of jump candidates for the read pointer from a respective position of the selected jump candidate.

16. The FIFO memory circuit of claim 10 wherein the jump in the write pointer to the new position comprises a non-consecutive jump from the current position.

17. A method of operating a bi-synchronous electronic device comprising a first-in-first-out (FIFO) memory circuit, the method comprising:
using a first digital circuit coupled to the FIFO memory circuit to
operate based upon a first clock signal, and
write to the FIFO memory circuit based upon a write pointer;
using a second digital circuit coupled to the FIFO memory circuit to
operate based upon a second clock signal different from the first clock signal, and
read from the FIFO memory circuit based upon a read pointer; and
using the FIFO memory circuit to
detect a jump in the write pointer to a new position,
determine a plurality of jump candidates for the read pointer from a current position,
select a jump candidate from the plurality thereof, and
synchronize the read pointer based upon the selected jump candidate.

18. The method of claim 17 wherein each jump candidate comprises a Gray encoding jump candidate for the read pointer from the current position.

19. The method of claim 17 further comprising using the FIFO memory circuit to select the jump candidate based upon a distance between the new position and respective positions of the plurality of jump candidates.

20. The method of claim 17 further comprising using the FIFO memory circuit to discard jump candidates with respective positions less than the current position and greater than the new position.

21. The method of claim 17 further comprising using the FIFO memory circuit to synchronize the read pointer by Gray encoded incrementing the read pointer from a respective position of the selected jump candidate to the new position.

22. The method of claim 17 further comprising using the FIFO memory circuit to, when an additional jump in the write pointer is detected, determine a second plurality of jump candidates for the read pointer from a respective position of the selected jump candidate.

* * * * *